United States Patent
Jaber et al.

[11] Patent Number: 6,055,658
[45] Date of Patent: Apr. 25, 2000

[54] APPARATUS AND METHOD FOR TESTING HIGH SPEED COMPONENTS USING LOW SPEED TEST APPARATUS

[75] Inventors: Talal Kamel Jaber; Johnny James LeBlanc; Ronald Gene Walther, all of Austin, Tex.

[73] Assignee: International Business Machines Corporation, Armonk, N.Y.

[21] Appl. No.: 08/537,647

[22] Filed: Oct. 2, 1995

[51] Int. Cl.[7] ................................................ G01R 31/28
[52] U.S. Cl. ............................................................ 714/726
[58] Field of Search ........................... 371/22.3, 22.1, 371/22.4, 22.5; 324/73.1; 375/106; 714/707, 726, 727, 731, 733, 744

[56] References Cited

U.S. PATENT DOCUMENTS

| | | | |
|---|---|---|---|
| 4,710,927 | 12/1987 | Miller | 371/15 |
| 4,969,148 | 11/1990 | Nadeau-Dostie et al. | 371/21.1 |
| 5,095,262 | 3/1992 | Henley et al. | 324/73.1 |
| 5,181,191 | 1/1993 | Farwell | 368/113 |
| 5,208,838 | 5/1993 | Wendell et al. | 375/106 |
| 5,254,942 | 10/1993 | D'Souza et al. | 324/158 R |
| 5,329,533 | 7/1994 | Lin | 371/22.3 |
| 5,355,369 | 10/1994 | Greenbergerl et al. | 371/22.3 |
| 5,381,420 | 1/1995 | Henry | 371/22.3 |
| 5,396,170 | 3/1995 | D'Souza et al. | 324/158.1 |
| 5,453,993 | 9/1995 | Kitaguchi et al. | 371/22.5 |
| 5,524,035 | 6/1996 | Casal et al. | 377/47 |
| 5,524,114 | 6/1996 | Peng | 371/22.1 |

OTHER PUBLICATIONS

"Off–Chip Module Clock Controller," *IBM Technical Disclosure Bulletin*, vol. 32, No. 4A, pp. 77–78, Sep. 1989.

"LOCST: A Built–in Self–test Technique," *IEEE Design & Test*, pp. 45–52, Nov. 1984.

*Primary Examiner*—Robert W. Beausoliel, Jr.
*Assistant Examiner*—Nadeem Iqbal
*Attorney, Agent, or Firm*—Leslie A. Van Leeuwen; Anthony V. S. England

[57] ABSTRACT

A system for testing a high speed integrated circuit includes a test device having a test clock with a first maximum frequency for performing level sensitive scan design (LSSD) testing of the integrated circuit device under test, a frequency multiplier circuit for multiplying the test clock signal to a higher second frequency capable of operating the device under test, and a finite state machine for generating a first internal clock for testing the device under test. In a practical embodiment, the internal clock speed may be running at a frequency many multiples of the test clock. Alternatively, a method of testing a device under test (DUT) at design speed includes running a predetermined group of tests with a test device operating at a lower speed than the design speed; incorporating LSSD or boundary scan test techniques in the device under test, together with a frequency multiplying device; generating a global clock for the device under test from the frequency multiplying circuit and using a finite state machine as a synchronizer and pulse generator to control a capture clock with respect to the global clock.

5 Claims, 3 Drawing Sheets

FIG. 1
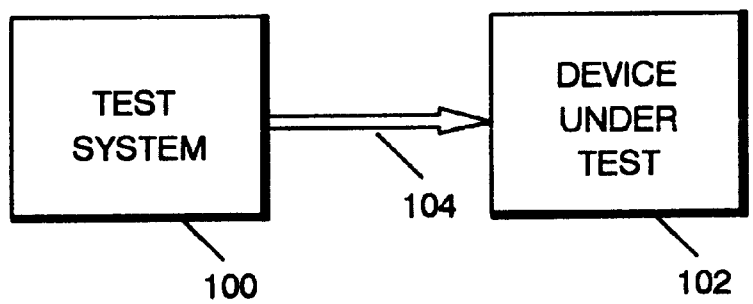
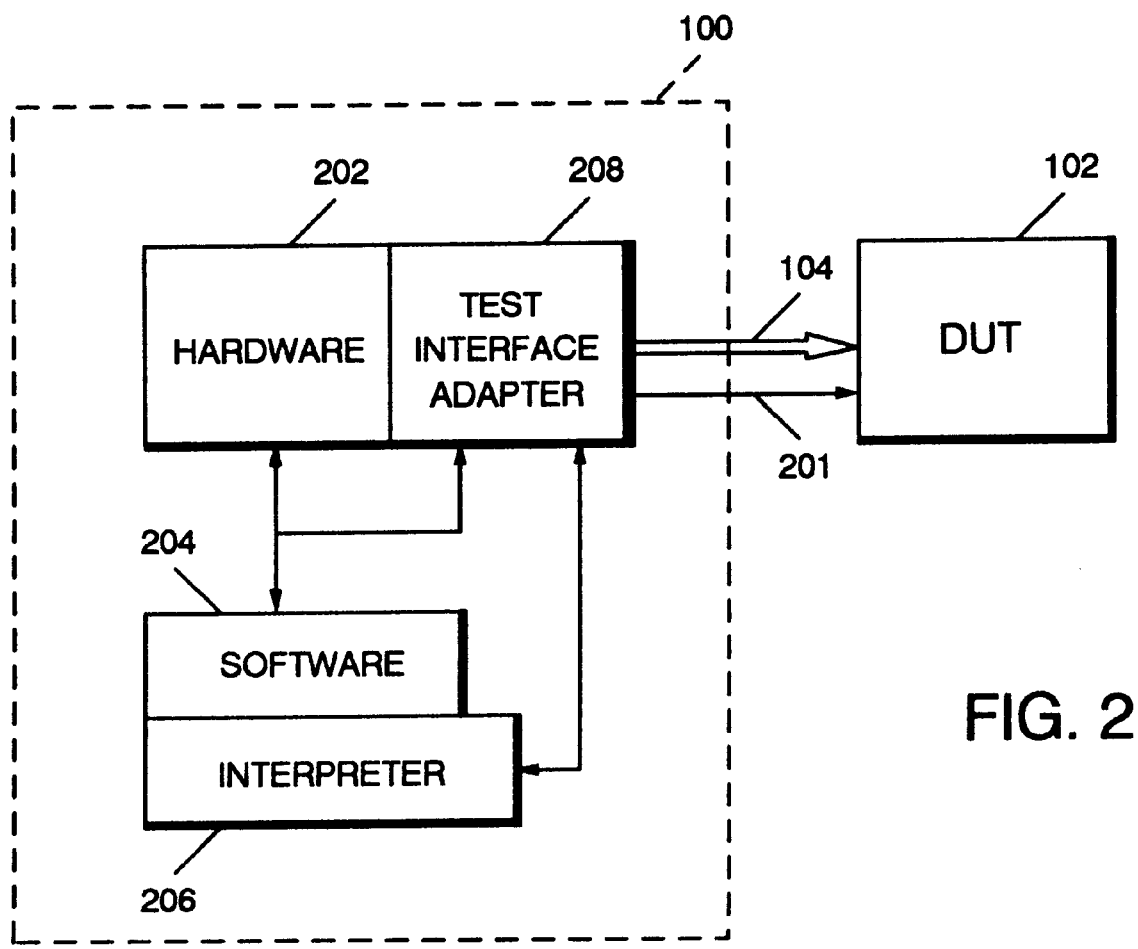
FIG. 2

APPARATUS AND METHOD FOR TESTING HIGH SPEED COMPONENTS USING LOW SPEED TEST APPARATUS

BACKGROUND OF THE INVENTION

1. Field of the Invention

The present invention relates to apparatus and method for testing electronic components, and more particularly to apparatus and method for testing high speed components by test apparatus having lower speed clock capability than the high speed component being tested.

2. Prior Art

In the prior art there are many techniques for testing high speed electronic components. The following are examples of such prior art techniques.

U.S. Pat. No. 5,396,170 shows an integrated test architecture which can be used in conformity with the IEEE 1149.1 test standard (JTAG) and configured on a single chip. The architecture of the patent uses the JTAG standard with additional logic on the single chip which permits "at speed" functional test of integrated circuits.

Although the patent discusses tester architecture for testing an integrated circuit "at speed," the patent only shows at speed testing for boundary scan and input/output circuit testing. The patent does not teach nor disclose testing the internal logic of a device under test at speed. Further, the patent does not teach nor suggest how the test apparatus clock is used to perform "at speed" tests.

Although the patent generally shows testing of a high speed integrated circuit using a lower speed tester, the patent does not teach nor suggest the present invention as claimed herein.

U.S. Pat. No. 5,381,420 teaches an interface to internal scan paths within an integrated circuit for synchronizing a test clock and a system clock without adversely affecting the operation of either. The system clock drives the test data through the scan path at the system clock rate, the two clocks are decoupled in that they run independently, being synchronized by the interface for clocking the test data into, through, and out of the scan path.

As above, the 420 patent shows an enhancement to the IEEE 1149.1 standard including a decoupled scan path interface. However, the patent does not teach nor suggest the invention as claimed herein.

U.S. Pat. No. 5,329,533 shows a partial scan built-in self-test technique. However, the patent does not teach nor suggest testing at system speed and does not teach nor suggest the present invention as claimed herein.

U.S. Pat. No. 5,254,942 is the parent of U.S. Pat. No. 5,396,170 above and contains the same disclosure as the 170 patent. The comments made with respect to the 170 patent apply to the 942 patent as well.

U.S. Pat. No. 5,208,838 teaches a clock multiplier circuit which is selectable to provide either an unmultiplied input clock to the internal clock line or a multiplied clock signal depending upon the state of a test mode input signal. By providing the circuitry on an integrated circuit chip, the chip can be driven at its normal operating frequency using lower frequency test equipment.

Although the patent teaches a selectable multiplier circuit for multiplying a test clock signal to a normal operating frequency signal for a device under test, the patent does not teach nor suggest the present invention as claimed herein.

U.S. Pat. No. 5,181,191 teaches a circuit for transferring data between automatic test equipment and an integrated circuit under test pursuant to a slow clock which can have an arbitrarily long period and for operating storage elements in the integrated circuit pursuant to a fast clock having a short period that corresponds to the clock rate at which combinatorial networks in the integrated circuit are to be tested. Although the patent teaches a first clock having a long period and a second clock having a relatively short period, the patent does not teach nor suggest how the clocks are generated.

The patent does not teach nor suggest the present invention as claimed herein.

U.S. Pat. No. 5,095,262 teaches a high speed electro optic test system for testing high speed electronic devices and integrated circuits using a programmable reference clock source providing clock pulses for accurately timing a stimulus pattern in precise synchronism with optical sampling pulses. Although the patent teaches the testing of high speed electronic devices, the use of the optical sampling pulses in synchronism with a stimulus pattern is not related to the present invention as claimed herein.

U.S. Pat. No. 4,969,148 teaches a serial testing technique for embedded memories including a finite state machine adapted to actuate multiplexor units to connect first bits and for each address output a series of test bits shifting those bits through the addressed word by a series of read and write operations and examining those bits after passage through the address word for defects in the memory circuit at that address. Although the patent teaches a finite state machine for controlling application of signals in a serial testing technique or in embedded memory, the patent does not teach nor suggest the present invention as claimed herein.

U.S. Pat. No. 5,355,369 teaches the testing of high speed core logic circuitry by transferring a test program to a special test data register which downloads the program to the logic circuitry under test and uploads the results. This technique allows the core logic to perform the test at its normal operating speed while still retaining compatibility with the JTHE standard for other tests.

The patent does not teach any special relationship between a test apparatus clock and a system clock. Also, the patent requires a dual ported random access memory and a read-only memory for conducting the tests described in the patent. For these reasons, the patent does not teach nor suggest the present invention as claimed herein.

SUMMARY OF THE INVENTION

Therefore, it is an object of the present invention to test an integrated circuit at system speed employing a clock signal generator controlled by a finite state machine.

It is another object of the present invention to test a high speed integrated circuit using a test system having a much lower maximum clock speed than the device under test.

Accordingly, a system for testing a high speed integrated circuit includes a test device having a test clock with a first maximum frequency for performing level sensitive scan design (LSSD) testing of the integrated circuit device under test, a frequency multiplier circuit for multiplying the test clock signal to a higher second frequency capable of operating the device under test, and a finite state machine for generating a first internal clock for testing the device under test. In a practical embodiment, the internal clock speed may be running at a frequency many multiples of the test clock.

Alternatively, a method of testing a device under test (DUT) at design speed includes running a predetermined group of tests with a test device operating at a lower speed than the design speed; incorporating LSSD or boundary scan test techniques in the device under test, together with a frequency multiplying device; generating a global clock for the device under test from the frequency multiplying circuit and using a finite state machine as a synchronizer and pulse generator to control a capture clock with respect to the global clock.

It is a feature of the present invention that testing of high speed integrated circuits may be accomplished using a low speed test device in a manner that is more efficient in time and at a lower cost than prior art test systems.

Other features and advantages of the present invention will become apparent in the following detailed description of the preferred embodiment of the invention taken in conjunction with the accompanying drawing.

BRIEF DESCRIPTION OF THE DRAWINGS

FIG. 1 is a block diagram of the test environment in accordance with the present invention.

FIG. 2 is a block diagram showing the functional elements of a test system which may be employed with the present invention.

DETAILED DESCRIPTION OF A PREFERRED EMBODIMENT OF THE INVENTION

Figure 3:
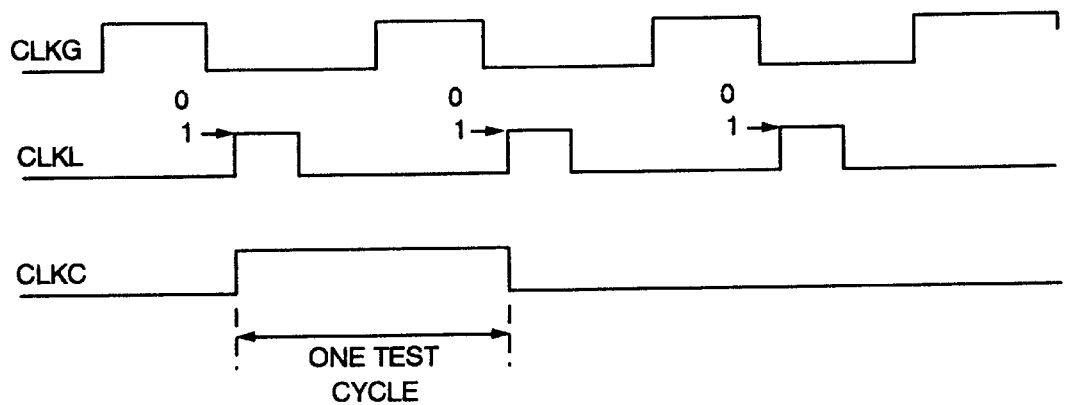
FIG. 3 is a timing diagram showing selected clock signals in accordance with the present invention.

Referring now to FIG. 1, a test environment in which the present invention may be employed will be described.

A test system 100 performs tests on device under test (DUT) 102 by sending test signals to DUT 102 over lines 104.

Referring now to FIG. 2, aspects of level sensitive scan design (LSSD) testing will be described as it applies to the present invention. It should be noted that LSSD testing, although employed with the present invention, is ancillary to the present invention in that the present invention is directed primarily to solving the problem of testing a high speed device with a test system which has a lower speed clocking capability.

Test system 100 may be controlled by a personal computer which includes hardware 202, software 204, an interpreter 206, and a test interface adapter 208 which communicates directly over lines 104 with device under test 102. A primary input clock CLK-PI running at the test system speed, for example, 40 Mhz, is transmitted from test system 100 to DUT 102 on line 201. CLK-PI is the primary input from which high speed clocking signals required for testing DUT 102 are generated as will be described below.

Test interface adapter 208 provides LSSD scan controls, clock controls, and primary input clock CLK-PI.

The apparatus and method according to the present invention allows at speed testing of an integrated circuit chip which, for example, may have an operational clock speed of 320 Mhz using a test system which has a maximum clock frequency of 40 Mhz.

To accomplish the "at speed" testing of the integrated circuit chip, DUT 102, the present invention employs a frequency multiplier to multiply the input clock frequency CLK-PI to chip operational speed and a finite state machines (FSM) to generate a test cycle pulse to define the period during which test data will be captured and sent to tester 100.

Referring now to FIG. 3, the timing of global internal clock CLKG, launch clock CLKL, and capture clock CLKC will be described.

CLKG is generated from an on-chip phase locked loop oscillator (not shown) which, through an on-chip frequency multiplier (also not shown) produces a clock signal CLKG which runs at the normal operational speed for the chip, for example, 320 Mhz.

As can be seen from FIG. 3, launch clock CLKL produces a pulse of predetermined duration (perhaps 25 percent of the period of CLKG) in response to a falling edge of the CLKG pulse. Capture clock CLKC produces a test cycle window which is opened on the rise of a launch clock CLKL and closed on the rise of the next CLKL pulse for each tester cycle. Thus, there will be one test cycle window in CLKC equal to a period of the high speed on-chip clock for each cycle of the low speed tester.

Figure 4:
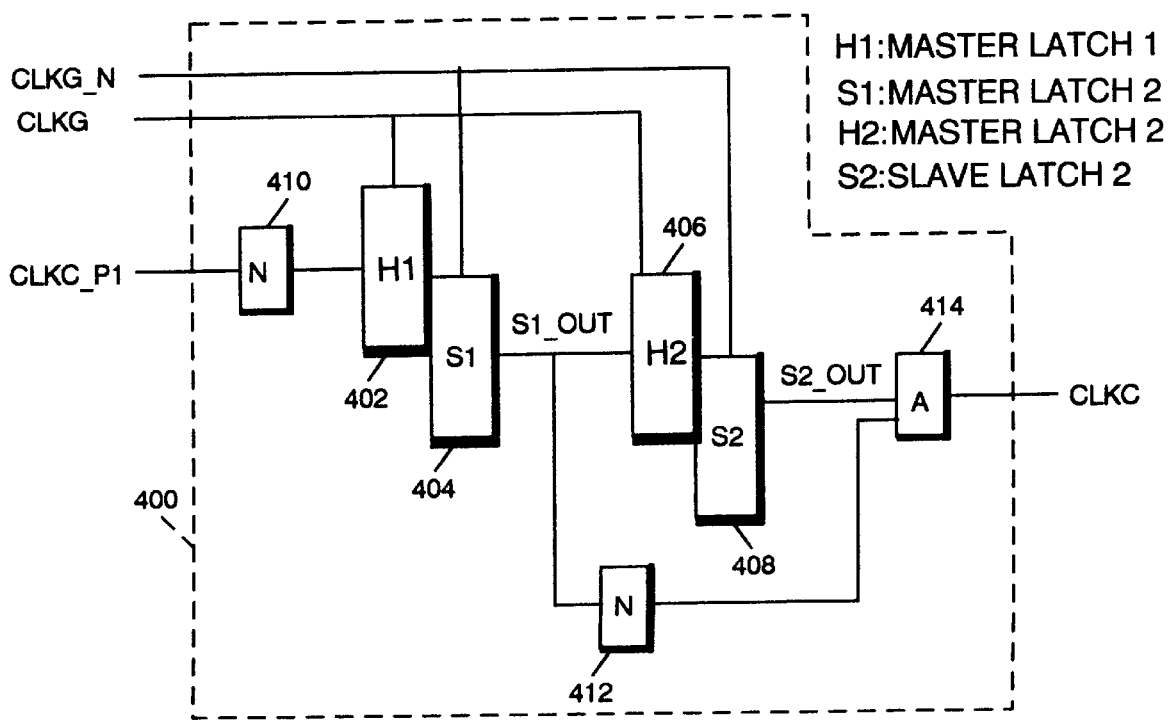
FIG. 4 is a logic diagram of a finite state machine synchronizer and pulse generator in accordance with the present invention.
Figure 5:
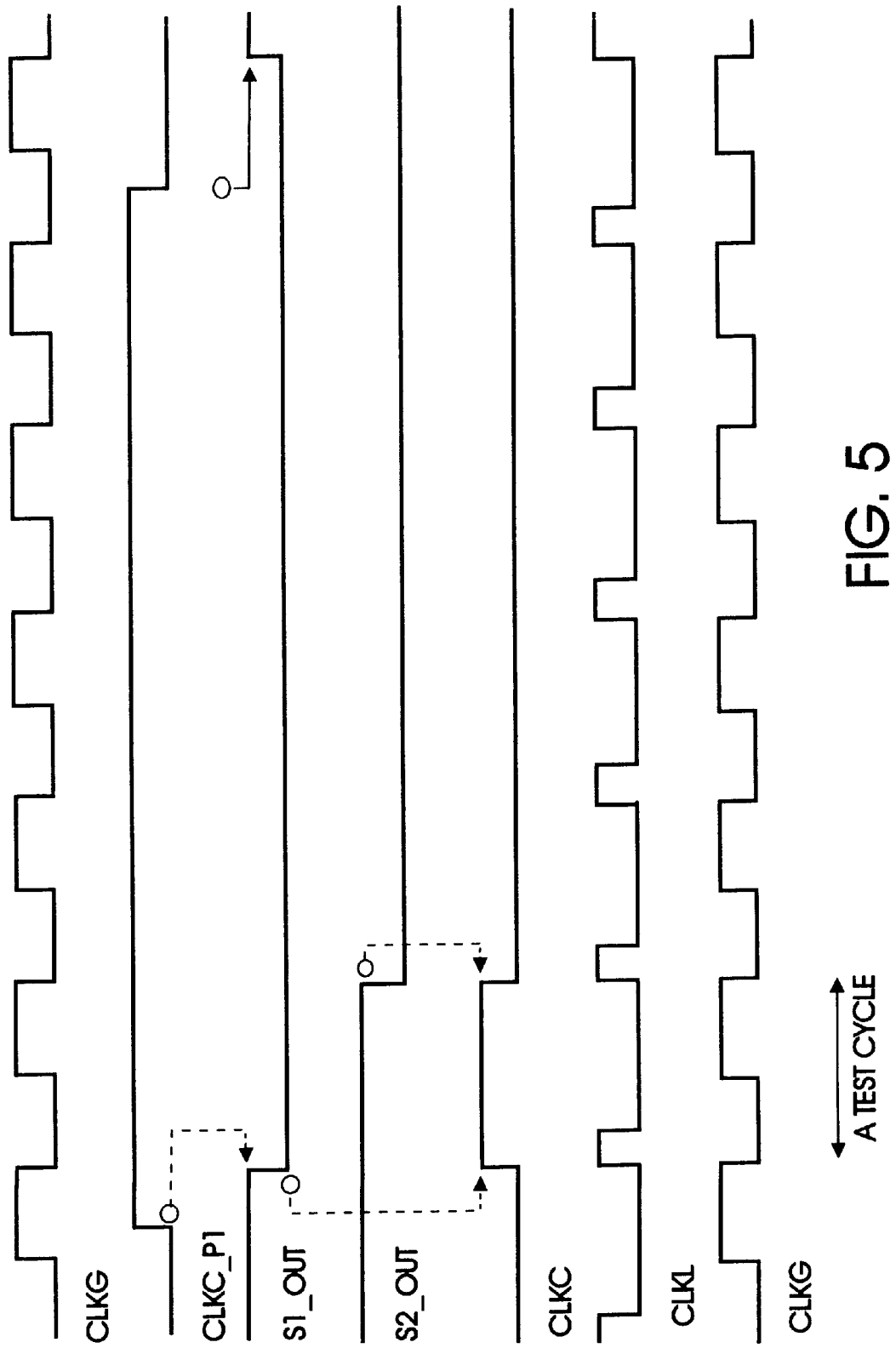
FIG. 5 is a timing diagram showing finite state machine input and output clock signals in accordance with the present invention.

Referring now to FIGS. 4 and 5, the finite state machine synchronizer and pulse generator will be further described.

FSM 400 includes two latch pairs H1, S1 402 and 404 and H2, S2 406 and 408. The CLKG signal is input to latches H1, 402 and H2, 406. The inverted CLKG signal is input to slave latch S1, 404 and S2, 408. Primary input clock CLKC-PI is input to latch H1, 402 through inverter 410. The output of slave latch S1, 404 is connected to an input of master latch 2, H2, 406 and to inverter 412. The output of slave latch S2, 408 and inverter 412 are inputs to AND gate 414 which produces as an output CLKC, the capture clock.

The operation of the finite state machine 400 will be described with reference to timing diagram shown in FIG. 5.

CLKG is running at the device under test operational speed, for example, 320 Mhz. When CLKC-PI rises, first latch pair 402, 404 produces a falling signal at the output of slave latch 1, 404. The fall of the output of slave latch 404 causes the rise of the CLKC capture clock test cycle as was described above with reference to FIG. 3.

On a next cycle of CLKG, the output of slave latch 408 drops, resulting in a mismatch in the input signals to AND gate 414, thus causing CLKC to drop, ending the test cycle. The synchronized CLKC pulse is used to capture test response data within one CLKG cycle time, thus achieving a test of the device under test at system speed.

It will be appreciated that although a specific embodiment of the present invention has been described herein for the purposes of illustration, various modifications may be made without departing from the spirit or scope of the invention.

Accordingly, the scope of this invention is limited only by the following claims and their equivalents.

What is claimed is:

1. Apparatus for testing a high speed electronic component, comprising:

a test device for performing a scan test of said high speed electronic component, the test device having a test clock with a first frequency;

an oscillator for generating a clock signal at a second frequency, said oscillator circuit adapted to operate asynchronously from said test clock;

a frequency multiplier circuit for multiplying said second frequency clock signal to a third frequency to produce a clock signal capable of operating said electronic component at an operational rate, wherein said third frequency clock signal operates asynchronously from said test clock; and a finite state machine for generating a test clock capture signal for capturing test data, wherein said test clock capture signal is synchronized with an output of said frequency multiplier circuit, and wherein said test clock capture signal operates asynchronously from said test clock signal.

2. Apparatus for testing a high speed electronic component, according to claim 1, wherein said scan test is a level sensitive scan design test.

3. Apparatus for testing a high speed electronic component, according to claim 1, wherein said finite state machine comprises logic circuits responsive to said output of said frequency multiplier and said test clock.

4. A method for generating a clock signal for testing an electronic component at an operational rate, comprising the steps of:

generating a clock signal, wherein said generated clock signal has a frequency greater than a tester clock frequency, and wherein said generated clock signal operates independently from said tester clock frequency;

multiplying said generated clock signal in a frequency multiplier to achieve a clock signal at the operational rate of said electronic component; and generating, under control of a finite state machine, a test data capture clock signal, wherein said test data capture clock signal is synchronized to said operational clock rate signal, and wherein said test data capture clock signal operates asynchronously from said tester clock frequency.

5. A method for generating a test clock signal, according to claim 4, wherein said generating step further comprises:

opening a test data capture window in response to a first occurrence of a launch clock signal; and closing said test data capture window in response to a second occurrence of said launch clock signal.

* * * * *